(12) United States Patent
Liu

(10) Patent No.: US 12,416,867 B2
(45) Date of Patent: Sep. 16, 2025

(54) OVERLAY TARGET AND OVERLAY METHOD

(71) Applicant: United Microelectronics Corp., Hsinchu (TW)

(72) Inventor: Hui Liu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 373 days.

(21) Appl. No.: 17/961,575

(22) Filed: Oct. 7, 2022

(65) Prior Publication Data

US 2024/0103383 A1    Mar. 28, 2024

(30) Foreign Application Priority Data

Sep. 22, 2022   (TW) .................................. 111135839

(51) Int. Cl.
*G03F 7/00*    (2006.01)
*H01L 23/544*    (2006.01)

(52) U.S. Cl.
CPC ........ *G03F 7/70633* (2013.01); *H01L 23/544* (2013.01); *H01L 2223/54426* (2013.01)

(58) Field of Classification Search
CPC ............. G03F 7/70633; G03F 7/70683; H01L 2223/54426; H01L 23/544; G09G 3/006; H10K 2102/311; H10K 59/1213; H10K 59/124; H10K 59/131; H10K 71/70; H10K 77/111

See application file for complete search history.

(56) References Cited

U.S. PATENT DOCUMENTS

| 4,343,877 | A | * | 8/1982 | Chiang | .................. H10D 89/10 |
| | | | | | 430/311 |
| 7,804,994 | B2 | | 9/2010 | Adel et al. | |
| 11,532,566 | B2 | * | 12/2022 | Volkovich | ............. H01L 23/544 |
| 11,862,524 | B2 | * | 1/2024 | Steely-Tarshish | ...... H01L 22/34 |
| 2004/0121587 | A1 | * | 6/2004 | Sakai | ................ H01L 21/76877 |
| | | | | | 257/E21.585 |
| 2010/0227451 | A1 | * | 9/2010 | Suzuki | .................. H01L 23/544 |
| | | | | | 257/E21.54 |
| 2016/0179017 | A1 | * | 6/2016 | Yohanan | ............. G03F 7/70633 |
| | | | | | 359/566 |
| 2018/0364179 | A1 | * | 12/2018 | Gready | ........... G01N 21/95607 |
| 2021/0240089 | A1 | * | 8/2021 | Golotsvan | ............. G01N 21/47 |
| 2023/0213873 | A1 | * | 7/2023 | Ma | ..................... G03F 7/706837 |
| | | | | | 430/22 |
| 2024/0004310 | A1 | * | 1/2024 | Blanton | .............. G03F 7/70683 |
| 2024/0111220 | A1 | * | 4/2024 | Cheng | ................. G03F 7/70633 |

* cited by examiner

*Primary Examiner* — Deoram Persaud
(74) *Attorney, Agent, or Firm* — JCIPRNET

(57) ABSTRACT

An overlay target includes a plurality of working zones, a plurality of holes in each of the working zones, and a first layer filling in the plurality of holes. The plurality of holes are not filled up by the first layer, and a plurality of spaces are reserved in the plurality of holes.

9 Claims, 3 Drawing Sheets

OVERLAY TARGET AND OVERLAY METHOD

CROSS-REFERENCE TO RELATED APPLICATION

This application claims the priority benefit of Taiwan application serial no. 111135839, filed on Sep. 22, 2022. The entirety of the above-mentioned patent application is hereby incorporated by reference herein and made a part of this specification.

BACKGROUND

Technical Field

The disclosure relates to a semiconductor device and a manufacturing method thereof, and in particular relates to an overlay target and an overlay method for an overlay mark.

DESCRIPTION OF RELATED ART

A lithography process is a patterning technology widely used in semiconductor manufacturing process. The lithography process is usually aligned by overlay marks. However, if a blanket-type metal layer is to be patterned, it is difficult to calculate the correct overlay error because the metal layer is opaque.

SUMMARY

The disclosure provides an overlay target, which may be used to accurately measure overlay errors.

An overlay target of an embodiment of the disclosure includes multiple working zones, multiple holes in each of the working zones, and a first layer filling in the holes. The holes are not filled up by the first layer, and multiple spaces are reserved.

An overlay method of an embodiment of the disclosure is used to determine an overlay error of a device structure formed in a semiconductor manufacturing process, including the following operation. A first overlay target is formed, including the following operation. Multiple working zones are provided, and multiple holes are formed in a first sub-zone of each of the working zones. A first layer is formed in the holes, in which the holes are not filled up by the first layer, and multiple spaces are reserved. The spaces have a first diameter and a second diameter greater than the first diameter. Multiple midpoints of the second diameters of the spaces are taken as multiple calibration center points of the holes. A second overlay target is formed, including forming multiple line segments in a second sub-zone of each of the working zones. The overlay error of the device structure is determined by using the calibration center points and multiple centers of the line segments.

Based on the above, the overlay target of the overlay mark according to the embodiment of the disclosure may overcome the problem that the calculation of the overlay error is difficult because the previous layer is a blanket-type opaque material, and may accurately calculate the correct overlay error.

DETAILED DESCRIPTION OF DISCLOSED EMBODIMENTS

Figure 1:
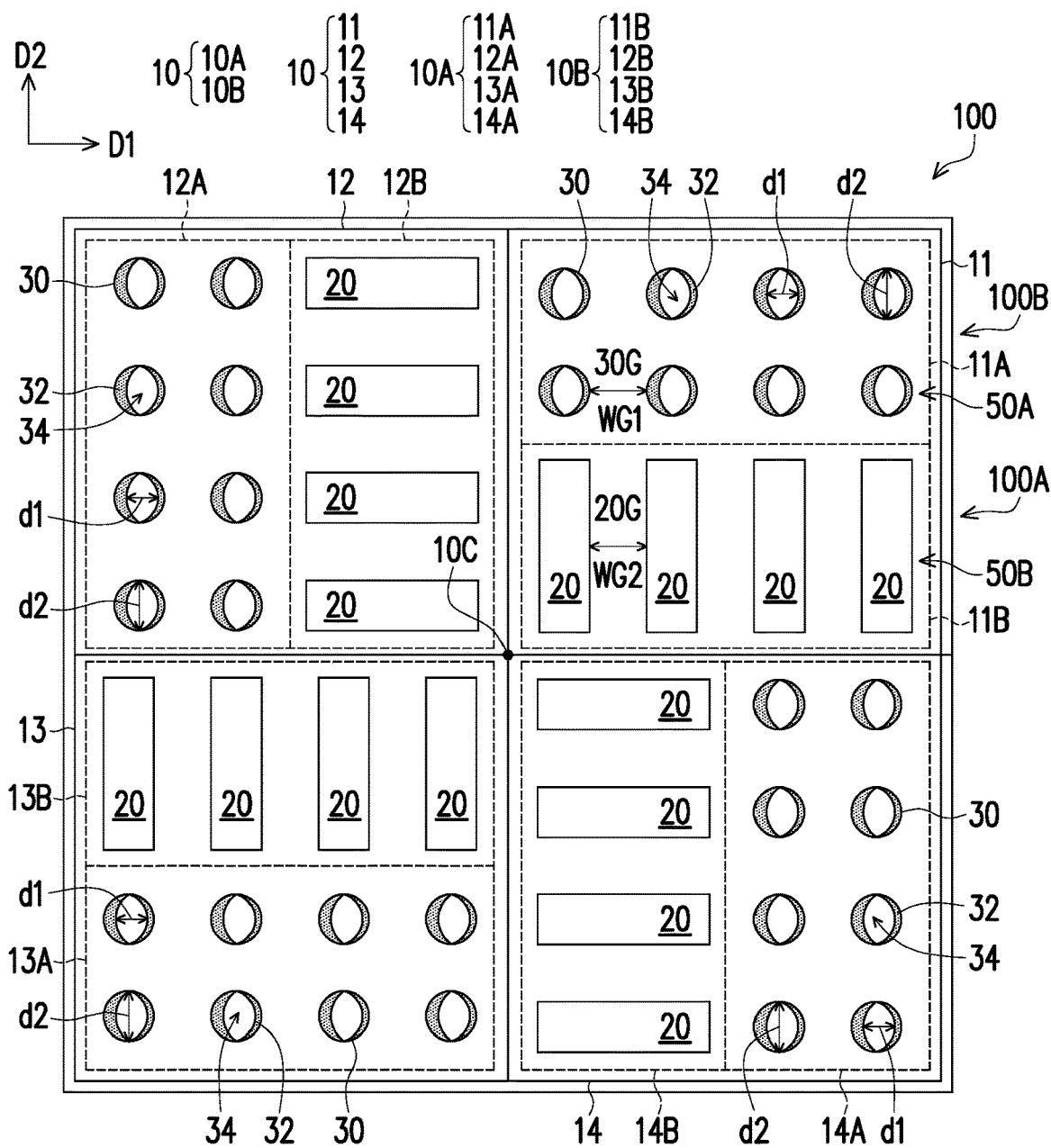
FIG. 1 is a top view of an overlay mark in accordance with an embodiment of the disclosure.
Figure 2:
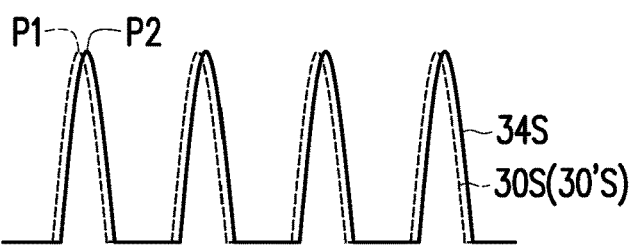
FIG. 2 is a waveform diagram of the third working zone of the first overlay target of FIG. 1.
Figure 3A:
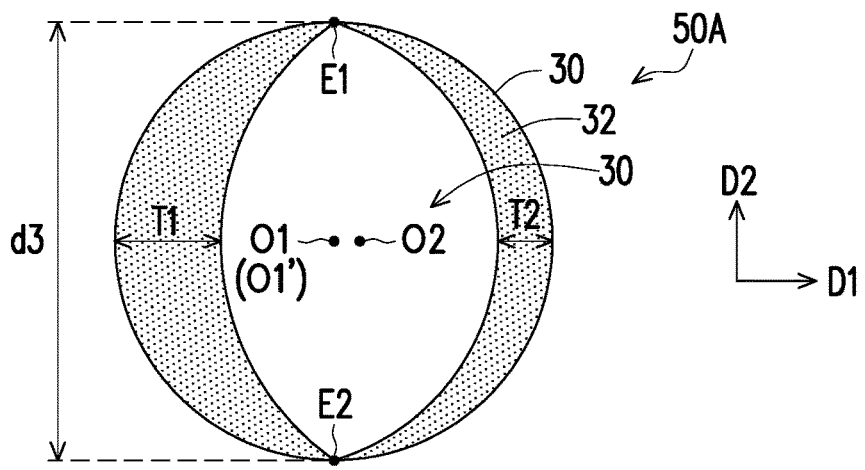
FIG. 3A is a partial enlarged view of a unit of the first overlay target of FIG. 1.
Figure 3B:
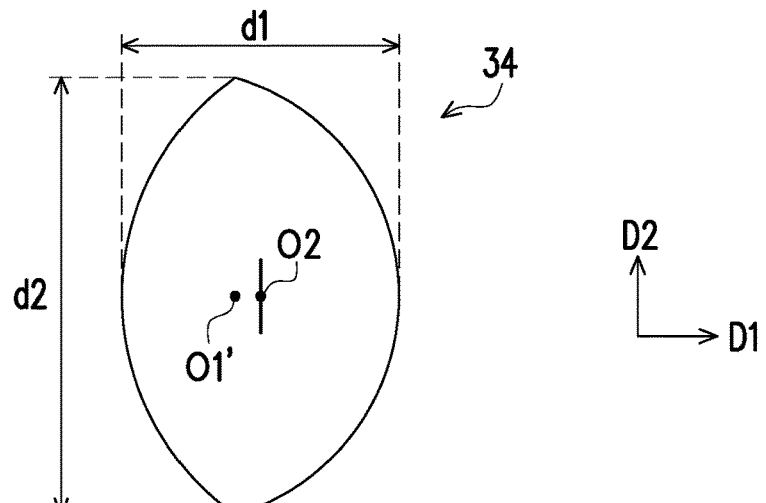
FIG. 3B is a schematic view of the space within the hole of FIG. 3A.
Figure 3C:
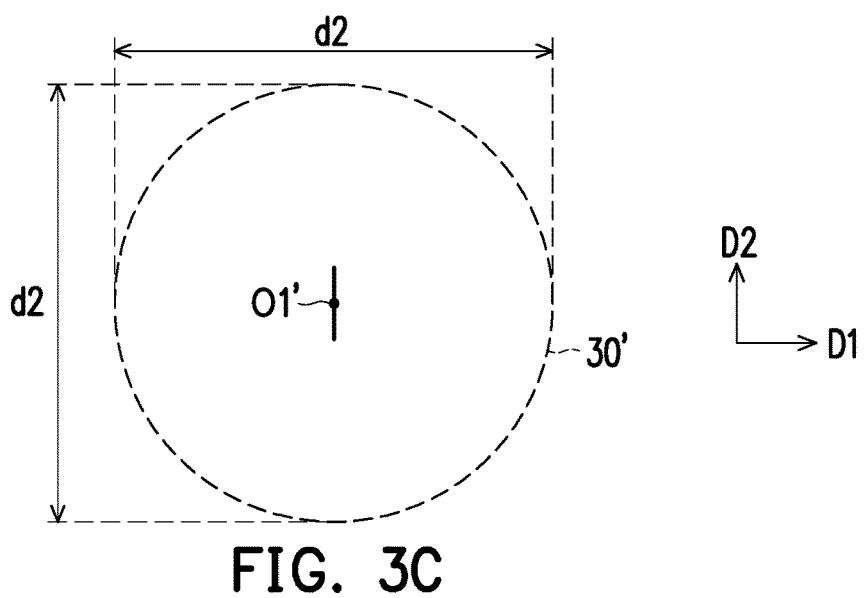
FIG. 3C is a schematic view of a dummy hole reconstructed according to the calibration center point and the second diameter of FIG. 3B.

FIG. 1 is a top view of an overlay mark in accordance with an embodiment of the disclosure. FIG. 2 is a waveform diagram of the third working zone of the first overlay target of FIG. 1. FIG. 3A is a partial enlarged view of a unit of the first overlay target of FIG. 1. FIG. 3B is a schematic view of the space within the hole of FIG. 3A. FIG. 3C is a schematic view of a dummy hole reconstructed according to the calibration center point and the second diameter of FIG. 3B.

Referring to FIG. 1, an overlay mark 100 includes multiple working zones 10, a first overlay target 100A, and a second overlay target 100B. Each of the working zones 10 includes a first sub-zone 10A and a second sub-zone 10B. In this embodiment, the working zones 10 include, for example, a first working zone 11, a second working zone 12, a third working zone 13, and a fourth working zone 14. The width, length, and area of the first working zone 11, the second working zone 12, the third working zone 13, and the fourth working zone 14 may be approximately equal, and the configurations are rotationally symmetric. The first working zone 11 includes a first sub-zone 11A and a second sub-zone 11B. The second working zone 12 includes a first sub-zone 12A and a second sub-zone 12B. The third working zone 13 includes a first sub-zone 13A and a second sub-zone 13B. The fourth working zone 14 includes a first sub-zone 14A and a second sub-zone 14B.

Referring to FIG. 1, a first overlay target 100A may be used for a previous layer of a semiconductor device. The second overlay target 100B may be used for the present layer of the semiconductor device. The first overlay target 100A of the overlay mark 100 is adjacent to the second overlay target 100B. The first overlay target 100A is disposed in the first sub-zone 10A. The second overlay target 100B is disposed in the second sub-zone 10B.

Referring to FIG. 1, multiple second sub-zones 10B surround the center point 10C of the overlay mark 100, and the configuration thereof is rotationally symmetric. The width, length, and area of the second sub-zones 10B may be approximately equal. The second overlay target 100B includes multiple units 50B. Each unit 50B is a line segment 20. In some embodiments, the line segments 20 may be rectangular. The rectangular line segments 20 are approximately equal in width, approximately equal in length, approximately equal in area, and are parallel to each other. The widths WG2 of the gaps 20G between the line segments 20 may be approximately equal. However, the disclosure is not limited thereto.

Referring to FIG. 1, the line segments 20 of the second sub-zone 11B of the first working zone 11 and the line segments 20 of the second sub-zone 13B of the third working zone 13 extend along the D2 direction and are arranged along the direction D1. The line segments 20 of the second sub-zone 12B of the second working zone 12 and the line segments 20 of the second sub-zone 14B of the fourth working zone 14 extend along the direction D1 and are arranged along the direction D2. The direction D1 and the direction D2 are perpendicular to each other. In other words, the line segments 20 in the second sub-zone 11B are parallel to each other and parallel to the line segments 20 of the second sub-zone 13B. The line segments 20 in the second sub-zone 12B are parallel to each other and parallel to the line segments 20 of the second sub-zone 14B.

In some embodiments, the line segments 20 in the second sub-zones 11B and 13B are symmetrical to the center point 10C. The line segments 20 in the second sub-zones 12B and 14B are symmetrical to the center point 10C. In other words, the length, width, number, arrangement of the line segments 20 and the width WG2 of the gap 20G in the second sub-zone 11B are the same as the length, width, number, arrangement of the line segments 20 and the width WG2 of the gap 20G in the second sub-zone 13B. The length, width, number, arrangement of the line segments 20 and the width WG2 of the gap 20G in the second sub-zone 12B are the same as the length, width, number, arrangement of the line segments 20 and the width WG2 of the gap 20G in the second sub-zone 14B. However, the disclosure is not limited thereto. The units 50B in each of the sub-zones 10B may be arranged in other shapes, lengths, widths, and numbers, and the widths WG2 of the gaps 20G may be equal or unequal.

Referring to FIG. 1, the shape of the first overlay target 100A is different from the shape of the second overlay target 100B. The first overlay target 100A includes multiple first sub-zones 10A, and multiple holes 30 and a first layer 32 in each of the first sub-zones 10A.

The first sub-zones 10A of the first overlay target 100A surround multiple second sub-zones 10B. In some embodiments, the configuration of the first sub-zones 10A is rotationally symmetric. For example, the first sub-zones 10A of the first overlay target 100A include first sub-zones 11A, 12A, 13A, and 14A. The first sub-zone 11A of the first working zone 11 is longitudinally adjacent to the second sub-zone 11B. The first sub-zone 12A of the second working zone 12 is laterally adjacent to the second sub-zone 12B. The first sub-zone 13A of the third working zone 13 is longitudinally adjacent to the second sub-zone 13B. The first sub-zone 14A of the fourth working zone 14 is laterally adjacent to the second sub-zone 14B. The width, length, and area of the first sub-zones 11A to 14A may be approximately equal.

Referring to FIG. 1, the first overlay target 100A includes multiple units 50A. A unit 50A is a hole 30. In some embodiments, the holes 30 in the same working zone 10 are in a regular pattern, with approximately the same size and approximately the same shape. In some embodiments, the diameter d2 of the hole 30 is, for example, 0.6 micrometers to 1.5 micrometers. The widths WG1 of the gaps 30G between the holes 30 are approximately equal. The holes 30 may be arranged in an array. For example, in some embodiments, the holes 30 in the first sub-zone 11A of the first working zone 11 and in the first sub-zone 13A of the third working zone 13 may be respectively arranged in a 4×2 array, and the holes 30 in the first sub-zone 12A of the second working zone 12 and in the first sub-zone 14A of the fourth working zone 14 may be respectively arranged in a 2×4 array. However, the embodiments of the disclosure are not limited thereto. In some embodiments of the disclosure, the holes 30 in each column of the first working zone 11 and the third working zone 13 correspond to a single line segment 20, and the holes 30 in each row of the second working zone 12 and the fourth working zone 14 correspond to a single line segment 20. However, the embodiments of the disclosure are not limited thereto.

Figure 4:
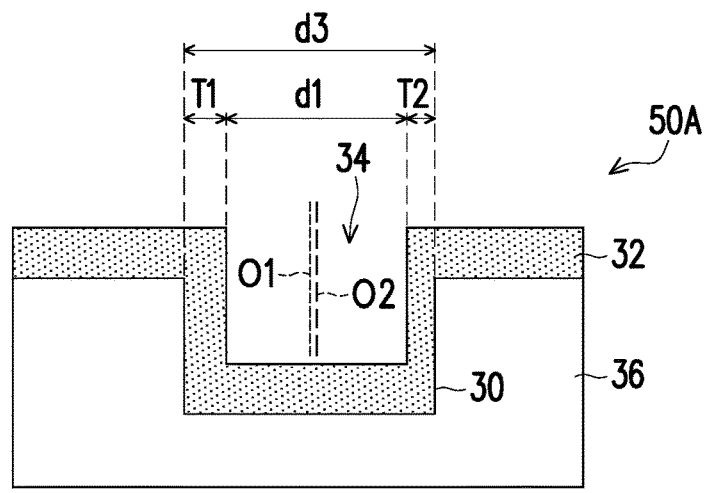
FIG. 4 is a cross-sectional schematic view of a unit of a first overlay target in an overlay mark zone according to an embodiment of the disclosure.

FIG. 4 is a cross-sectional schematic view of a unit of a first overlay target in an overlay mark zone according to an embodiment of the disclosure.

Referring to FIG. 4, multiple holes 30 are formed in a second layer 36. In some embodiments, the holes 30 extend from the upper surface of the second layer 36 to the lower surface, but do not penetrate the second layer 36. In other embodiments, the holes 30 may extend from the upper surface of the second layer 36 to the lower surface and penetrate the second layer 36 (not shown). The second layer 36 may be a dielectric material on a semiconductor substrate, such as silicon oxide, silicon nitride, aluminum oxide, or a low-k (low dielectric constant) dielectric material.

Referring to FIG. 1, FIG. 3A, and FIG. 4, the first layer 32 of the first overlay target 100A covers the second layer 36 and fills the holes 30. The first layer 32 is deposited by a physical vapor deposition method, such as sputtering, therefore, the first layer 32 may also be called a deposition layer or a blanket layer. In some embodiments, the first layer 32 is an opaque layer. The opaque layer is, for example, a metal layer. The metal layer is, for example, Ta, Al, Ir, or a combination thereof. The metal layer may be a single layer or multiple layers.

Referring to FIG. 4, in the disclosure, the holes 30 are not filled up by the first layer 32, and multiple spaces 34 are reserved. Therefore, the maximum thickness of the first layer 32 (e.g., the thickness T1) is less than the radius of the hole 30 (i.e., half of the diameter d3). Furthermore, the thickness of the first layer 32 on the sidewall of the hole 30 is not the same due to the characteristics of the manufacturing process machine. For example, referring to FIG. 4, in some embodiments, the first layer 32 is formed by physical vapor deposition (PVD), and is affected by the PVD shadowing effect, such that the first layer 32 on the two side walls of the hole 30 has different thicknesses T1 and T2. The shapes of the spaces 34 are different from the shapes of the holes 30 due to the different thicknesses of the first layer 32 on the side walls of the holes 30. In some embodiments, the holes 30 are centrally symmetric, such as circular, and the spaces 34 are asymmetric, irregular circles, such as off-axis football shapes, as shown in FIG. 1 and FIG. 3A. In FIG. 1, the spaces 34 have a regular pattern, however, the shapes of the spaces 34 may be different and irregular due to manufacturing processing factors.

Referring to FIG. 3A and FIG. 3B, the hole 30 has a diameter d3. The diameters d3 of the holes 30 in the same working zone 10 are approximately the same or similar. However, each of the spaces 34 reserved in the hole 30 has a first diameter d1 and a second diameter d2 larger than the first diameter d1 for reasons explained below.

Figure 5:
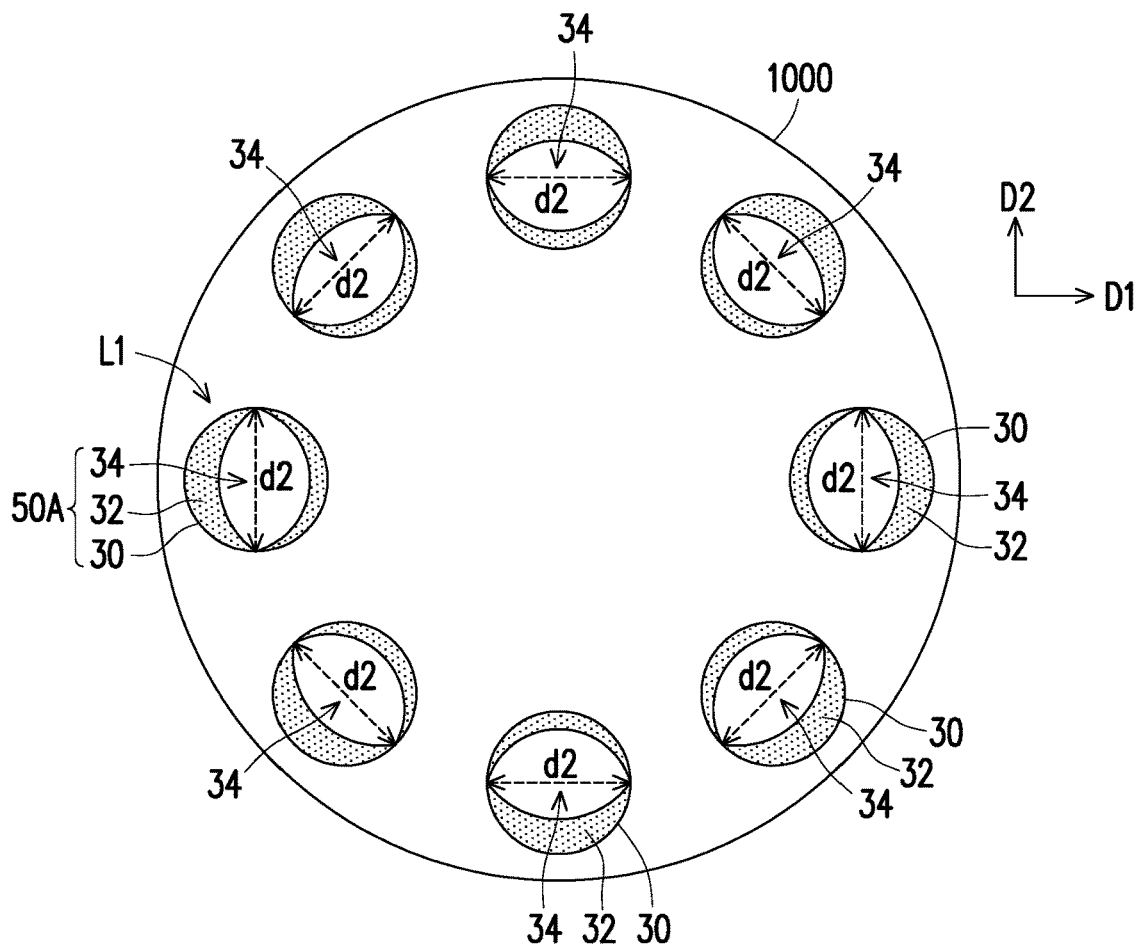
FIG. 5 is a top view of the units of the first overlay target at various locations on the wafer.

FIG. 5 is a top view of the units of the first overlay target at various locations on the wafer.

Referring to FIG. 5, since the distances between different positions of a wafer 1000 and the target are different, while also affected by the PVD shadowing effect, the thickness of the first layer 32 formed in the holes 30 in a specific direction (e.g., the direction in which the first diameter d1 extends) is not uniform, while the other direction (e.g., the direction in which the second diameter d2 extends) is less affected by the shadowing effect, so that the thickness in the other direction is approximately equal. Moreover, the thickness of the first layer 32 formed in the holes 30 of the wafer 1000 has different distributions according to the positions of the holes 30, so that the extending direction of the second diameter d2 of the spaces 34 left by the holes 30 at different positions are different. Therefore, the units 50A of the first overlay target 100A of the disclosure may be disposed on various positions of the wafer 1000. For the sake of brevity, the hole 30 and the space 34 in FIG. 3A are used for illustration, but are not intended to limit the disclosure. The hole 30 and the space 34 in FIG. 3A are, for example, the hole 30 at the position L1 in FIG. 5.

Referring to FIG. 3A and FIG. 3B, the first diameter d1 of the space 34 reserved in the hole 30 is parallel to the direction D1, and the second diameter d2 is parallel to the direction D2. The first diameter d1 is the largest diameter of the space 34 in the direction D1, and the second diameter d2 is the largest diameter of the space 34 in the direction D2.

Referring to FIG. 3A and FIG. 3B, since the hole 30 is centrally symmetric and the space 34 is asymmetric, the midpoint O2 of the space 34 in the direction D1 does not coincide with the center point O1 of the hole 30 in the direction D1. Referring to FIG. 1, FIG. 2, and FIG. 3A, an optical signal 30S is the actual optical signal of the hole 30 in the third working zone 13 in the direction D1 (if the first layer 32 is transparent), the center point O1 of the hole 30 in the direction D1 should correspond to the peak P1 of the optical signal 30S. However, since the first layer 32 is opaque, the optical signal 30S cannot be obtained. The obtained optical signal 34S is the optical signal in the direction D1 actually measured, which is the optical signal in the direction D1 from the space 34. The peak P2 of the light signal 34S corresponds to the midpoint O2 of the space 34 in the direction D1. The peak P2 of the optical signal 34S does not coincide with the peak P1 of the optical signal 30S, but has an offset. Therefore, the disclosure does not use the midpoint O2 of the space 34 in the direction D to calculate the overlay error in the direction D1, such as the X direction, but uses the midpoint O1' of the space 34 in the direction D2 as the calibration center point O1', as detailed below.

Referring to FIG. 3A to FIG. 3C, in some embodiments, the thickness of the first layer 32 at the positions E1 and E2 of the hole 30, that is, the two ends of the second diameter d2 of the space 34, is the least affected by the shadowing effect, so the thickness difference is very small, even almost equal. Therefore, the midpoint O1' of the space 34 in the direction D2 is very close to the center point O1 of the hole 30, or even coincides with the center point O1 of the hole 30.

Therefore, the overlay method of an embodiment of the disclosure used to determine an overlay error of a device structure formed in a semiconductor manufacturing process may obtain information of the second diameter d2 of the space 34 in the direction D2 based on the optical signal in the direction D2, and may use the midpoint O1' of the second diameter d2 as the calibration center point O1'. Taking the calibration center point O1' as the center of the circle and ½ of the second diameter d2 as the radius, a dummy hole 30' may be reconstructed and obtained, as shown in FIG. 3C. The obtained dummy hole 30' is symmetric and a regular circle. The obtained calibration center point O1' of the dummy hole 30' is very close to the center point O1 of the hole 30, and may even coincide with the center point O1 of the hole 30. Also, the obtained dummy hole 30' may have the same or similar shape as the hole 30. In addition, compared to the first diameter d1 of the space 34, the obtained second diameter d2 of the dummy hole 30' is closer to the diameter d3 of the hole 30. In other words, the converted optical signal 30'S obtained by the dummy holes 30' is very close to the optical signal 30S of FIG. 2.

Afterwards, the overlay error of the device structure may be determined by using multiple calibration center points O1' of each of the working zones 10 and multiple centers of the line segments. For example, the average position Px' of the previous layer in the X direction may be determined by the calibration center points O1' of the dummy holes 30' in the first working zone 11 and the third working zone 13. The average position Px of the present layer in the X direction may be determined by the centers of the line segments 20 of the first working zone 11 and the third working zone 13. Therefore, the overlay error ΔX between the present layer and the previous layer in the X direction may be obtained from the difference between the average position Px and the average position Px'.

In the second working zone 12 and the fourth working zone 14 of FIG. 1, the second diameter d2 of the space 34 in the hole 30 is in the D2 direction. Obtaining the midpoint O1' of the second diameter d2 according to the abovementioned method, and using the midpoint O1' as the calibration center point O1', the average position Py' of the previous layer in the Y direction may be determined. The average position Py of the present layer in the Y direction may be determined by the line segments 20 of the first working zone 11 and the third working zone 13. Therefore, the overlay error ΔY between the present layer and the previous layer in the Y direction may be obtained from the difference between the average position Py and the average position Py'. The obtained overlay errors (ΔX, ΔY) may be immediately fed back to the scanning exposure machine before the etching process, therefore there is need to etch and pattern the first layer 32 to know the result of the overlay. In addition, the disclosure may collect related data such as the offset between the overlay errors (ΔX, ΔY) in the lithography stage and the overlay errors obtained after etching, to serve as the data of the library of lithograph modeling recipe. In this way, in the lithography stage, the overlay result after etching may be simulated according to the obtained overlay result at the lithography stage.

In other words, by designing the first overlay target for the previous layer as holes through the embodiment of the disclosure, and by filling the holes with the first layer while also reserving spaces without filling up the holes, it is possible to calculate the correct position of the previous layer and then to calculate a substantially correct overlay error as early as in the lithography stage, and to infer the overlay error after etching from the overlay error at the lithography stage. Therefore, the overlay mark of the embodiment of the disclosure may be used to accurately measure the overlay error in the lithography stage, so as to avoid the inability to measure and calculate the overlay error because the previous layer is opaque.

What is claimed is:

1. An overlay method, used to determine an overlay error of a device structure formed in a semiconductor manufacturing process, comprising:
   forming a first overlay target, comprising:
   providing a plurality of working zones;
   forming a plurality of holes in a first sub-zone of each of the working zones; and
   forming a first layer in the holes, wherein the holes are not filled up by the first layer, and a plurality of spaces are reserved, the spaces have a plurality of first diameters and a plurality of second diameters greater than the first diameters;
   taking a plurality of midpoints of the second diameters of the spaces as a plurality of calibration center points;

forming a second overlay target, comprising forming a plurality of line segments in a second sub-zone of each of the working zones; and determining the overlay error of the device structure by using the calibration center points and a plurality of centers of the line segments.

2. The overlay method according to claim 1, wherein the first layer is an opaque layer.

3. The overlay method according to claim 1, wherein the opaque layer comprises a metal layer.

4. The overlay method according to claim 1, wherein the first layer is a deposition layer formed on a second layer and filled in a plurality of openings of the second layer.

5. The overlay method according to claim 4, further comprising that the spaces are asymmetric.

6. The overlay method according to claim 1, wherein a maximum thickness of the first layer in the holes is less than a radius of the holes.

7. The overlay method according to claim 1, wherein a thickness of the first layer in the holes is not uniform.

8. The overlay method according to claim 1, wherein shapes of the spaces are different from shapes of the holes.

9. The overlay method according to claim 8, wherein the holes are circular and the spaces are off-axis football-shaped.

* * * * *